(12) United States Patent
Fasano et al.

(10) Patent No.: US 6,187,418 B1
(45) Date of Patent: Feb. 13, 2001

(54) MULTILAYER CERAMIC SUBSTRATE WITH ANCHORED PAD

(75) Inventors: Benjamin V. Fasano, New Windsor; David H. Gabriels, Cold Spring; Richard F. Indyk, Wappingers Falls, all of NY (US); Sundar M. Kamath, San Jose, CA (US); Scott I. Langenthal, Hyde Park, NY (US); Srinivasa S. N. Reddy, LaGrangeville, NY (US); Rao V. Vallabhaneni, Hopewell Junction, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/356,944

(22) Filed: Jul. 19, 1999

(51) Int. Cl.[7] .................. B32B 3/00; H05K 1/09
(52) U.S. Cl. .......... 428/210; 428/209; 174/257; 174/261; 174/262
(58) Field of Search .................. 428/210, 209; 174/261, 262, 257

(56) References Cited

U.S. PATENT DOCUMENTS

| | | | | |
|---|---|---|---|---|
| 4,070,518 | * | 1/1978 | Hoffman | 428/210 |
| 5,293,504 | * | 3/1994 | Knickerbocker et al. | 174/264 |
| 5,362,551 | * | 11/1994 | Okamoto et al. | 428/210 |
| 5,549,778 | | 8/1996 | Yokoyama et al. | 156/246 |
| 5,552,107 | * | 9/1996 | Casey et al. | 428/698 |

OTHER PUBLICATIONS

IBM Technical Disclosure Bulletin, L.W. Herron, et al., "Improved Metal–to–Ceramic Adhesion for MLC Structures", vol. 27, No. 8, Jan. 1985, p. 4765.

* cited by examiner

Primary Examiner—Cathy Lam
(74) Attorney, Agent, or Firm—Ira D. Blecker

(57) ABSTRACT

Disclosed is a multilayer ceramic substrate having an outer pad, for example an I/O pad, which is anchored to an inner pad of the multilayer ceramic substrate by either a plurality of vias or one large via. The outer pad and vias are made of high metal material, preferably 100% metal, so they won't adhere very well to the ceramic substrate. The inner pad is a composite metal/ceramic material which will bond very well to the ceramic substrate.

35 Claims, 6 Drawing Sheets

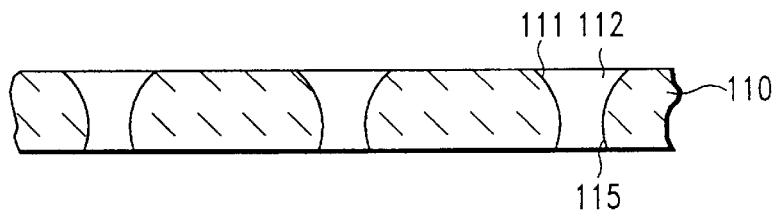
FIG. 3A
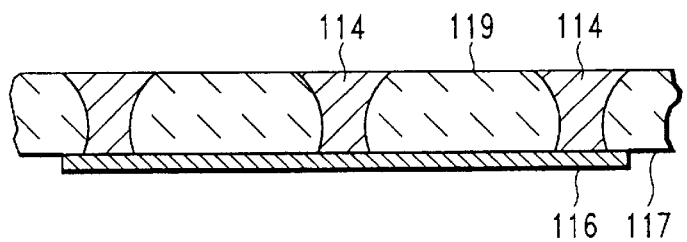
FIG. 3B
FIG. 3C
FIG. 3D
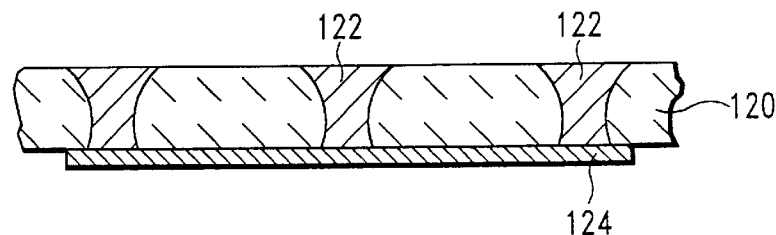
FIG. 3E
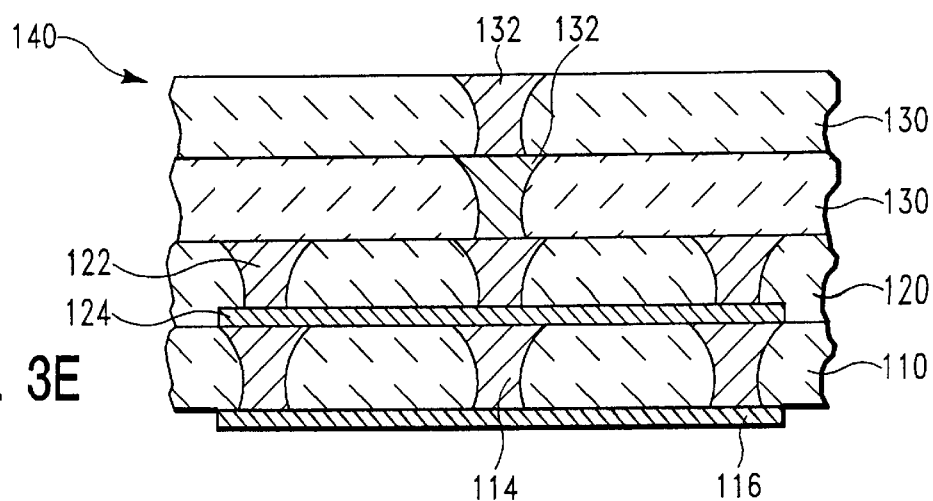

MULTILAYER CERAMIC SUBSTRATE WITH ANCHORED PAD

BACKGROUND OF THE INVENTION

This invention relates to the fabrication of multilayer ceramic substrates and, more particularly, relates to the forming of an electrically conductive surface pad using thick film techniques that has improved mechanical and electrical reliability.

Multilayer ceramic substrates are typically used for interconnection between integrated circuit devices used in information processing systems such as computers, control systems and circuit boards and are traditionally made using two processes. The oldest process is a layer build up process that starts with a fired ceramic layer onto which alternating patterned layers of dielectric and metal conductive layers are sequentially deposited by a screening operation to form a multilayer structure. These can be sintered after each deposition or sintered after all the layers are deposited. Sintering at sufficiently high temperatures consolidates the metal, ceramic and usually glass particles into a dense, impervious monolith that provides mechanical support of the electrically continuous circuit traces formed within the ceramic dielectric.

Another method to make multilayer ceramic substrates involves forming the dielectric into a tape by using a casting process, punching the tape to form holes or "vias" into which a conductive metal paste is deposited along with metal traces that act as wiring. A number of these punched and metallized tapes are aligned, stacked and pressed into a laminate that is subsequently sintered. Such a methodology is a cofired process in which the ceramic and metal powders are consolidated in essentially a single but often complex heating process.

A key element of the sintering process involves the formation of conductive surface features onto which metal plating such as nickel and gold may be deposited, sometimes as preparation for subsequent solder attach processes. These surface features provide connections to the electrical conductors within the ceramic and their mechanical and electrical performance are very important to the reliability of the multilayer ceramic substrate and the entire information processing system.

Traditional ceramic substrates are formed of aluminum oxide (i.e., alumina) which is typically bonded with a fused glass powder after sintering. Sintering of such aluminum oxide ceramic substrates is usually a high temperature process requiring temperatures in excess of 1500° C. Molybdenum and tungsten metal powders are used as the electrical conductor since these provide high electrical conductivity while tolerating this high sintering temperature without melting. These metals also have good thermal expansion match to alumina over the range of temperatures that occur from sintering to sub-ambient testing, typically from 1600° C. to −150° C. respectively. The coefficient of thermal expansion (CTE) of alumina, molybdenum and tungsten are similar at approximately 7, 5 and 4 ppm respectively.

Surface features made using these metals are typically well bonded to the ceramic in a cofiring process by using a glass powder incorporated into the thick film paste used to form the patterned surface feature. The surface features are well adhered and since there is a close CTE match between the surface features and the ceramic, and alumina ceramics are very strong, there is little stress placed on the underlying ceramic during thermal cycling.

The strength of the bond between the surface metal features and the ceramic is important when the surface features, typically present as an array, are electrically connected to a printed circuit board by a solder technique such as ceramic ball grid array (CBGA) and ceramic column grid array (CCGA). In the CBGA attach technique, a solder ball is used as a standoff between the substrate and a printed circuit board. The solder ball has a higher melting temperature than the solder used to attach the ball to the ceramic substrate and the board. Likewise a column of solder wire can be used to effect the connection between the ceramic substrate and the board in the CCGA attach technique.

The reliability of the electrical connection between the ceramic substrate and the board is affected by a number of parameters which include the CTE difference between the ceramic substrate and the board, the stiffness of both, the size of the solder array and the height of the solder join. During thermal cycling, the board expands and contracts much more than the ceramic substrate. This movement causes a large strain in the solder connections between the board and ceramic substrate, the greatest strain occurring at the outermost connections and the least at the center of the solder array. Repetitive thermal cycling eventually fatigues the solder connections to failure and this creates an open in the electrical pathway between the ceramic substrate and board.

Typically the longer the solder column, the greater the resistance to solder fatigue. CCGAs will withstand many more cycles to failure than CBGAs with all other parameters being equal, however CCGAs are less desirable than CBGAs since CCGAs can be easily damaged in handling and their increased solder length increase inductance which can impair electrical performance.

Information processing systems are increasingly moving towards higher speeds, more power and higher reliability. As part of this migration, the use of higher performance ceramic dielectrics in component packaging for semiconductor devices is becoming wide spread. In particular, the use of ceramic substrates that have increasingly high levels of silica which, when properly combined with other ceramic oxides, results in a lower dielectric constant material to reduce the propagation delay in electronic circuitry is desired. Unlike traditional high alumina ceramics, these ceramic substrates have lower strength and thus are more likely to fracture under loads imposed by solder joining.

Typical of these high performance ceramics are low temperature cofired ceramic systems that use silver or copper as conductors. These high performance ceramics include alumina bonded with low softening point glasses and glass ceramic systems. Unlike the high temperature cofired systems, the CTE differences between these ceramics and the metals are often high. For instance, most of these ceramics have a CTE below 6 ppm while the CTE of silver and copper are 20 and 17 ppm, respectively. Attempts to cofire high metal content surface features on the surface of these low CTE ceramics often results in weak interfaces between the ceramic and surface feature which can become separated during thermal cycling while in processing or use.

It follows then that during cofiring, these metals can be bonded to the ceramic to form high strength joints only by incorporating a large volume of lower CTE compensating filler material, often the same ceramic or glass used to produce the dielectric. This nonconductive filler material in the surface feature can have a severe impact on the electrical conductivity of the feature and cause great difficulty in creating an easily plateable surface feature for a land grid array (LGA) or solder attachment by CBGA or CCGA since the nonconductive portion of the pad will not typically plate with conventional plating baths.

Surface features made with high metal contents often subject the underlying ceramic to severe stresses during thermal cycling due to the large CTE mismatch. Since the high performance ceramic is not as strong as high temperature fired alumina, there is a great tendency to crack the ceramic and eventually cause the electrical connection under the surface feature to fail.

The lack of adhesion between high metal surface features and the underlying ceramic material has been recognized by others. For example, Yokoyama et al. U.S. Pat. No. 5,549,778 and Herron et al. IBM Technical Disclosure Bulletin, 27, No. 8, page 4765 (January 1985), the disclosures of which are incorporated by reference herein, have proposed "dummy" vias to anchor the surface feature to the underlying ceramic. These dummy vias are nonfunctioning and merely serve to mechanically assist in the anchoring of the surface feature.

IT would be desirable to have an improved way to anchor the surface feature while providing enhanced electrical and mechanical reliability.

This and other features of the invention will become more apparent after referring to the following description considered in conjunction with the accompanying drawings.

BRIEF SUMMARY OF THE INVENTION

According to a first aspect of the invention, there is disclosed a multilayer ceramic substrate with an anchored pad comprising:
  a first ceramic layer having a plurality of filled vias and an outer surface;
  at least one outer pad adjacent to the outer surface of the first ceramic layer, the at least one outer pad adhered to the plurality of filled vias in the first ceramic layer;
  a second ceramic layer adjacent to the first ceramic layer having at least one filled via in contact with at least one filled via of the first ceramic layer; and
  at least one inner pad interposed between the first and second ceramic layers and in contact with the plurality of filled vias in the first ceramic layer with each of the plurality of filled vias in the first ceramic layer being in contact with a via in the second ceramic layer or the inner pad.

According to a second aspect of the invention, there is disclosed a multilayer ceramic substrate with an anchored pad comprising:
  a first ceramic layer having a filled via and an outer surface;
  an outer pad adjacent to the outer surface of the first ceramic layer, the outer pad adhered to the at least one filled via;
  a second ceramic layer adjacent to the first ceramic layer having at least one filled via in contact with the filled via of the first ceramic layer;
  an inner pad interposed between the first and second ceramic layers and in contact with the filled vias of the first and second layers;
  wherein the via in the first ceramic layer is larger in cross section than the via in the second ceramic layer and the first ceramic layer is thicker than the second ceramic layer.

According to a third aspect of the present invention, there is disclosed a multilayer ceramic substrate with an anchored pad comprising:
  a first ceramic layer having a plurality of filled vias and an outer surface;
  a second ceramic layer adjacent to the first ceramic layer and having at least one filled via;
  at least one inner pad interposed between the first and second ceramic layers and in contact with the plurality of filled vias in the first ceramic layer and the at least one filled via in the second ceramic layer;
  a plurality of via columns extending from the outer surface of the first ceramic layer, the plurality of via columns being in contact with the plurality of filled vias of the first ceramic layer; and
  at least one pad adhered to the plurality of via columns.

According to a fourth aspect of the present invention, there is disclosed a multilayer ceramic substrate with an anchored pad comprising:
  a ceramic layer having at least one filled via and an outer surface;
  an inner pad adhered to the outer surface of the first ceramic layer and in contact with the at least one filled via in the first ceramic layer;
  a plurality of via columns extending from the inner pad; and
  an outer pad adhered to the plurality of via columns.

According to a fifth aspect of the present invention, there is disclosed a method of forming a multilayer ceramic substrate with an anchored pad, the method comprising the steps of:
  forming a first ceramic greensheet having a plurality of vias;
  screening a metallic paste material into the at least one via, the metallic paste material comprising at least 80 volume percent metallic material, the remainder being ceramic material, based on the solids content of the paste material;
  screening a metallic paste material onto the first ceramic greensheet to form an I/O pad, the metallic paste material comprising at least 80 volume percent metallic material, the remainder being ceramic, based on the solids content of the paste material;
  forming a second ceramic greensheet having at least one via;
  screening a metallic paste material into the at least one via of the second ceramic greensheet, the metallic paste material comprising 30 to 70 volume percent metallic material, the remainder being ceramic material, based on the solids content of the paste material;
  screening a metallic paste material onto the first or second ceramic greensheet to form an inner I/O pad, the metallic paste material comprising 30 to 70 volume percent metallic material, the remainder being ceramic, based on the solids content of the paste material;
  stacking the first and second greensheets to form an unsintered multilayer ceramic substrate wherein the I/O pad is on the outside of the unsintered multilayer ceramic substrate, the inner pad is interposed between the first and second ceramic greensheets, and each of the plurality of vias in the first ceramic greensheet is in contact with a via in the second ceramic greensheet or the inner contact pad; and
  sintering the unsintered multilayer ceramic substrate so that a sintered multilayer ceramic substrate having an I/O pad is adhered to the at least one via of the first ceramic layer but is not adhered to the ceramic material of the multilayer ceramic substrate.

According to a sixth aspect of the present invention, there is disclosed a method of forming a multilayer ceramic substrate with an anchored pad, the method comprising the steps of:

forming a first ceramic greensheet having at least one via, the first ceramic greensheet comprising ceramic material that is chosen so as not to sinter at a predetermined sintering temperature of the multilayer ceramic substrate;

screening a metallic paste material into the at least one via of the first ceramic greensheet, the metallic paste material comprising at least 80 volume percent metallic material, the remainder being ceramic material, based on the solids content of the paste material;

screening a metallic paste material onto the first ceramic greensheet to form an outer pad, the metallic paste material comprising at least 80 volume percent metallic material, the remainder being ceramic, based on the solids content of the paste material;

forming a second ceramic greensheet having at least one via;

screening a metallic paste material into the at least one via of the second ceramic greensheet, the metallic paste material comprising at least 80 volume percent metallic material, the remainder being ceramic material, based on the solids content of the paste material;

forming a third ceramic greensheet having at least one via;

screening a metallic paste material into the at least one via of the third ceramic greensheet, the metallic paste material comprising 30 to 70 volume percent metallic material, the remainder being ceramic material, based on the solids content of the paste material;

screening a metallic paste material onto the second or third ceramic greensheet to form an inner pad, the metallic paste material comprising 30 to 70 volume percent metallic material, the remainder being ceramic, based on the solids content of the paste material;

stacking the first, second and third ceramic greensheets to form an unsintered multilayer ceramic substrate wherein the outer pad is on the outside of the unsintered multilayer ceramic substrate and the inner pad is interposed between the second and third ceramic greensheets; and sintering the unsintered multilayer ceramic substrate at a predetermined temperature such that the first ceramic greensheet does not sinter while the second and third ceramic greensheets sinter;

removing the unsintered ceramic material that, prior to sintering, comprised the first ceramic greensheet leaving the at least one via of the first ceramic greensheet so that a sintered multilayer ceramic substrate having a pad is adhered only to the at least one via of the first ceramic greensheet and is spaced from the ceramic material of the multilayer ceramic substrate.

According to a seventh aspect of the present invention, there is disclosed a method of forming a multilayer ceramic substrate with an anchored pad, the method comprising the steps of:

forming a first ceramic greensheet having at least one via, the first ceramic greensheet comprising ceramic material that is chosen so as not to sinter at a predetermined sintering temperature of the multilayer ceramic substrate;

screening a metallic paste material into the at least one via of the first ceramic greensheet, the metallic paste material comprising at least 80 volume percent metallic material, the remainder being ceramic material, based on the solids content of the paste material;

screening a metallic paste material onto the first ceramic greensheet to form an outer pad, the metallic paste material comprising at least 80 volume percent metallic material, the remainder being ceramic, based on the solids content of the paste material;

forming a second ceramic greensheet having at least one via;

screening a metallic paste material into the at least one via of the second ceramic greensheet, the metallic paste material comprising 30 to 70 volume percent metallic material, the remainder being ceramic material, based on the solids content of the paste material;

screening a metallic paste material onto the first or second ceramic greensheet to form an inner pad, the metallic paste material comprising 30 to 70 volume percent metallic material, the remainder being ceramic, based on the solids content of the paste material;

stacking the first and second ceramic greensheets to form an unsintered multilayer ceramic substrate wherein the outer I/O pad is on the outside of the unsintered multilayer ceramic substrate and the inner pad is interposed between the second and third ceramic greensheets; and sintering the unsintered multilayer ceramic substrate at a predetermined temperature such that the first ceramic greensheet does not sinter while the second ceramic greensheet sinters;

removing the unsintered ceramic material that, prior to sintering, comprised the first ceramic greensheet leaving the at least one via of the first ceramic greensheet so that a sintered multilayer ceramic substrate having an pad is adhered only to the at least one via of the first ceramic greensheet and is spaced from the inner pad and ceramic material of the multilayer ceramic substrate.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIG. 3 illustrates a third embodiment of the present invention and a method for making the third embodiment.

DETAILED DESCRIPTION OF THE INVENTION

Figure 1A:
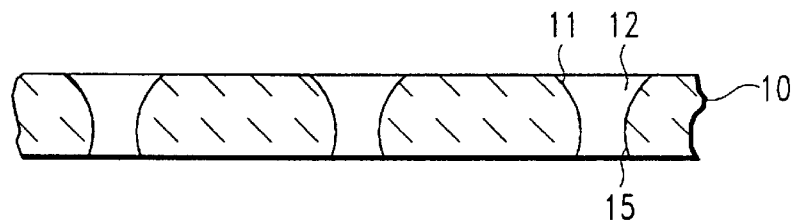
FIG. 1 illustrates a first embodiment of the present invention and a method for making the first embodiment.

The present inventors have developed a metallurgical structure that is designed to improve the mechanical and, more importantly, electrical reliability of surface mounted features (e.g., pads) that are used for connecting circuitry within a ceramic substrate to another device. This connection is typically performed with low temperature solders but may also use pressure assisted contacts as practiced with LGA sockets.

This novel metallurgical structure serves a number of functions that are critical to creating high reliability connections. First, it provides a means of attaching a plurality of electrically conductive surface features to the ceramic which may not otherwise be reliably attached to the ceramic. For instance, stresses as a result of a large difference in CTE between the ceramic and the surface feature metallurgy and/or very high stresses that can be created by a plating process, can cause the surface feature to delaminate from the ceramic or even crack the ceramic at the join during heating and cooling cycles and in use. The proposed structure of our invention isolates these stresses from the ceramic surface layer and transfers them to underlying layers which are able to withstand them.

Second, the structure provides a highly flexible electrical connection between the surface feature and metallurgical features within the ceramic substrate and, further, provides additional redundant electrical connections to the surface feature that improve the electrical reliability of ceramic packages that are joined using solders to printed circuit boards which typically have much greater CTEs than the ceramic. After solder mounting a ceramic substrate to a printed circuit board and subjecting the assembly to repeated thermal cycling to simulate the stresses encountered in actual field usage when power is cycled on and off, the electrical reliability performance of the structure is superior to any estimates based on CTE alone.

Third, the metallurgical structure of our invention also provides a more robust process for connecting a ceramic substrate to a board using solder ball heights where solder columns would typically be required for improved thermal cycling reliability. This allows lower inductance solder balls to be used for high performance packaging needs.

Lastly, the metallurgical structure of our invention allows the use of highly conductive metal compositions that are easily plated to provide high metal content (up to 100%) surface features using conventional plating chemistries. These high metal surface features allow complete solder wettability for improved solder joint reliability and current carrying capacity.

Referring to the Figures in more detail, and particularly referring to FIG. 1, there is shown a first embodiment of the present invention. As shown in FIG. 1a, a plurality of vias 12 is placed into first greensheet 10. These vias 12 are usually arranged so as to allow as many vias 12 as will fit within the area of a subsequent surface feature or, as shown here, a pad. Typically these vias would be between 50 and 150 microns for so-called input/output (I/O) pad diameters of approximately 850 microns that are used in 50 mil pitch CBGA solder connections. The shape of the ends of the via is important since the subsequent filling of the via with a thick film paste provides both mechanical anchoring and electrical connection of the conductive via to a second internal thick film pad. Straight side walls as obtained with a laser drilling process or other drilling process are least desirable since these will concentrate the strain from via stretching solely on the interface of the via and inner pad. Ideally a taper exists on the inside end of the via which will act to increase the area of contact between the via and the inner pad to which it will be sintered. Thus, tapered end 11 of via hole 12 is larger than end 15 of via hole 12. Such tapered holes are typically produced during the mechanical punching of the first greensheet 10.

Figure 1B:
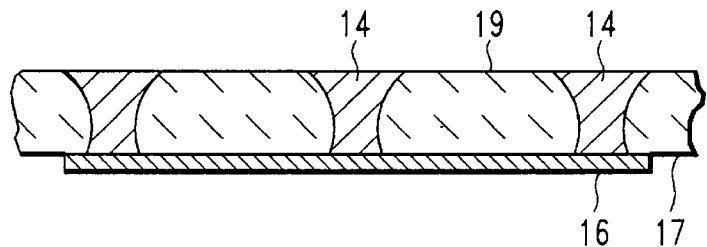

The vias 12 are filled with a metal paste 14, as shown in FIG. 1(b) preferably one which has a high metal content to provide high electrical conductivity and ductility.

The preferable metal is copper while alloys of nickel, copper, silver and the like can also be used. The metal content of the via and surface pad should be at least 80% by volume and preferably 100%. It should be understood throughout that a high metal content paste should be one that is 80 to 100 volume % metal based on the solids content of the paste.

Then a surface pad 16 is screened onto the outside surface 17 of first greensheet 10 as shown in FIG. 1(b). The size of the surface pad 16 is defined by the size of the I/O pads desired on the surface after sintering.

Figure 1C:
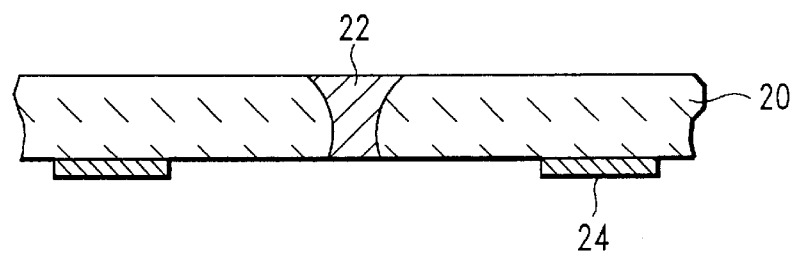

Next, as shown in FIG. 1(c), a second greensheet 20 is also punched and filled with a metal paste to form metal-filled vias 22. Inner pads 24 are screened on second greensheet 20. It should be understood that inner pads 24 could have just as easily been screened on the back side 19 of first greensheet 10. The metal-filled vias 22 and inner pads 24 are meant to provide good bonding to the ceramic so the metal loading of the paste is moderate, such as 30 to 70 volume % and more preferably 40 to 50 volume %, with the remainder being ceramic material. It should be understood that these volume amounts are based on the solids content of the paste, excluding the binders, plasticizers, and other components of the paste that are volatilized during sintering. It should further be understood that when moderate metal loading of the paste is mentioned, the paste is meant to have 30 to 70, and preferably 40 to 50, volume % metal based on the solids content of the paste. The metals again are preferably copper but could also be alloys of nickel, copper, silver and the like.

Figure 1D:
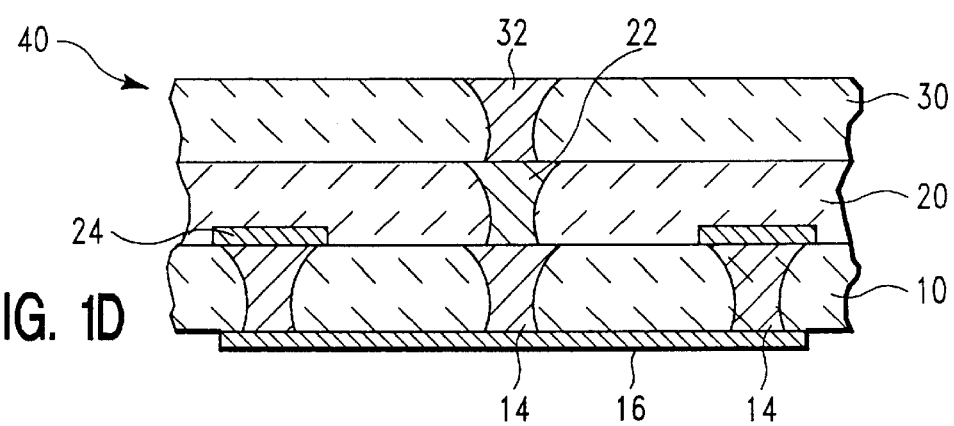

The last steps in the assembly are to stack and laminate first and second greensheets 10, 20 in the order shown in FIG. 1(d) to form multilayer greensheet laminate 40 with surface pad 16 being on the outside of the laminate 40. Inner pads 24 are adjacent to vias 14 to provide anchoring of the vias to the laminate 40. One via 14 in first greensheet 10 must align with via 22 in second greensheet 20 to provide electrical continuity. Normally, there will be at least one additional greensheet layer 30 (and there are often many such additional greensheet layers 30) having via 32 to complete greensheet laminate 40. Via 32, usually made of 100 volume % metal, is aligned with via 22 for electrical continuity. The greensheet laminate 40 is then sintered to result in a multilayer ceramic substrate substantially identical to that shown in FIG. 1(d).

It should be appreciated that surface pad 16 and vias 14, having high metal content, are not well adhered to the ceramic of the multilayer ceramic substrate. The pads 24 and the via 22, having high ceramic content, are well adhered to the ceramic. The attachment and mechanical reliability of surface pad 16 to the multilayer ceramic substrate is accomplished through the adhesion between vias 14 and inner pads 24.

The ceramic that comprises the multilayer ceramic substrate is most preferably the high performance, low temperature cofired ceramic alluded to earlier. However, it should be understood that the present invention may have applicability to all ceramic systems where surface pad reliability is of concern.

Referring now to FIG. 2, there is shown a second embodiment of the present invention. The second embodiment of the present invention is identical to the first embodiment of the present invention previously described with respect to FIG. 1 except that the second embodiment further includes ceramic layer 34 as shown in FIG. 2(d). Ceramic layer 34 has at least one opening 36 which is coincident with, but slightly smaller than, surface pad 16. During stacking and lamination, opening 36 aligns with surface pad 16 as shown in FIG. 2(e) where multilayer greensheet laminate 50 is formed. Instead of forming ceramic layer 34 as a stand alone layer, it can be screened directly onto greensheet laminate 50. Ceramic layer 34 serves two purposes. The first is that during sintering, ceramic layer 34 densifies and holds the perimeter of surface pad 16 to the ceramic. The second is that ceramic layer 34 acts as a solder dam to control the flow of solder during joining and keep the solder away from the perimeter of surface pad 16.

Referring now to FIG. 3, there is shown a third embodiment of the present invention. Referring to FIG. 3(a), first greensheet 110 is formed having vias 112 filled with a high metal content (i.e., 80–100 volume % metal) paste to form metal-filled vias 114 as shown in FIG. 3(a). A surface pad 116 is screened onto what will be the outer surface 117 of the first greensheet 110. First greensheet 110 is essentially identical to first greensheet 10 previously discussed.

Next, as shown in FIG. 3(c), a second greensheet 120 is also punched to form vias which are then filled with a metal paste to result in metal-filled vias 122 as shown in FIG. 3(d). These vias 122 align with the location of the pad 116 on the first greensheet 110 and will be fully captured within pad 116 when layers 110 and 120 are stacked together. The metal paste used to screen vias 122 is chosen so as to provide good bonding of the vias 122 to the ceramic. Typically these are moderately loaded metallization pastes as discussed previously. As also shown in FIG. 3(d), a pad 124 is deposited over vias 122 which will align with and capture the vias 112 in first greensheet 120. Pad 124 while shown being deposited on second greensheet 120 may, alternatively, be deposited on the back surface 119 of first greensheet 110. Pad 124 is screened with a metal paste that provides good bonding and electrical connectivity to both the metal-filled vias 122 and the ceramic of second greensheet 120. Typically these are also moderately loaded metallization pastes.

Thereafter, both metallized first and second greensheets 110 and 120 are stacked and laminated together with particular attention paid to the alignment of the inner pad 124 to the metallized vias 114 in first greensheet layer 110 to form multilayer greensheet laminate 140 as shown in FIG. 3(e). Additional dielectric layers 130 of having metal-filled vias 132, preferably 100 volume % copper, which provide wiring within the ceramic substrate are included during this stacking and lamination step. The vias 114, 122 and pads 116, 124 of first and second greensheet layers 110 and 120 are fully densified metal structures. High metal content pad 116 and vias 114 are only loosely adhered, if at all, to the ceramic. However, pad 116 is anchored to inner pad 124 through high metal content vias 114. Inner pad 124, being of moderate metal content, is well bonded to the ceramic. Thus, each via 114 provides a redundant electrical and mechanical connection between the inner pad 124 and outer pad 116.

A fourth embodiment of the present invention is shown in FIG. 4. In this embodiment, an additional layer of ceramic 134 is applied to the outside of first greensheet layer 110 just prior to lamination which helps to hold the metal pad 124 onto the ceramic after sintering. The processing in FIGS. 4(a) through 4(f) is similar to that of FIGS. 3(a) through 3(e). An additional greensheet layer 134 is prepared by punching or cutting open areas 136 in the greensheet layer 134 which are coincident with the position of the pad 116 deposited on first greensheet layer 110. These open areas 136 are slightly smaller than the diameters of pads 116. The open areas 136 in greensheet layer 134 are aligned with the pad 116 in first greensheet layer 110 during lamination and seal the edge of each pad 116 around its perimeter to the ceramic. During sintering, the layer 134 densifies and bonds the perimeter of the pad 116 to the ceramic to improve the adhesion of pad 116. Layer 134 can be applied in the form of a screenable dielectric paste if desired.

A fifth embodiment of the invention is illustrated in FIG. 5. First greensheet layer 210 is formed with metal-filled vias 212 and surface pad 216 as shown in FIG. 5(a). Second greensheet layer 220 is then formed with metal-filled vias 222 and inner pad 224. Inner pad 224 could be formed on second greensheet layer 220 or, alternatively, on optional greensheet layer 230 to be discussed hereafter. Metal-filled vias 222 and surface pad 216 are of high metal content with poor adhesion to ceramic while inner pad 224 is of moderate metal content and good adhesion to ceramic. First and second greensheet layers 210, 220 are then stacked and laminated with optional additional greensheet layers 230 having metal-filled vias, preferably filled with 100 volume % metal, to form multilayer greensheet laminate 240. Multilayer greensheet laminate 240 is then sintered in a conventional manner. The ceramic material for first greensheet layer 210 is chosen so that it does not densify during sintering. After sintering to form multilayer ceramic substrate 242, the ceramic of first greensheet layer 210 is removed by a process which does not damage the metal features such as by ultrasonic cleaning. Remaining are vias 212 with open areas 234 where the ceramic material used to be. Thereafter, the metal features are plated and the exposed surface of outer pad 216 is used to join a solder ball or column for subsequent attachment of the substrate to a circuit card or other device. Again, it can be appreciated that surface pad 216 is anchored to the multilayer ceramic substrate 242 by vias 212, 220 and inner pad 224, which is well-bonded to the ceramic.

A sixth embodiment of the present invention is shown in FIG. 6 wherein a metal surface pad is well bonded to a ceramic substrate. First a greensheet layer 210 is formed by punching and filling the vias with a high metal paste to form metal-filled vias 212. The ceramic of first greensheet layer 210 is chosen such that it does not undergo any significant densification during sintering. Then a pad 216 is formed on the greensheet using a high metal content paste. It is preferred that the metal content of vias 212 and pad 216 be 100 volume % metal after sintering. A second greensheet layer 220 is punched and screened with a moderate metal to form metal-filled vias 222, then pad 224 is screened onto second greensheet layer 220. The metal composition and ceramic filler of the pad 224 are chosen so as to provide good bonding of the pad 224 to the ceramic after sintering. Pad 224 can be screened on second greensheet layer 220 as shown in FIG. 6(b) or, alternatively, it could have been screened on side 219 of first greensheet layer 210. Vias 212 and pad 216 use a high metal paste that sinters to a density greater than 90%. Additional metallized greensheets 230 are aligned with first and second greensheet layers 210 and 220, stacked and laminated to form multilayer greensheet laminate 250. and the greensheet stack is laminated and sintered to form a multilayer electronic substrate. After sintering to form multilayer ceramic substrate 252, first greensheet layer 210 is removed by a process which does not damage the metal features, such as by ultrasonic cleaning. Remaining are vias 212 with open areas 234 where the ceramic material used to be. Thereafter the metal features are plated and the exposed surface of outer pad 216 is used to join a solder ball or column for subsequent attachment of the substrate to a circuit card or other device. In this case, the pad 224 on the ceramic surface is well bonded. If desired the space 234 between the outside pad 216 and pad 224 can be filled with a polymer to provide additional anchoring of the pad 216 to the ceramic as well as to support the structure and minimize handling damage. Polymers that can be used for this include polyimides, epoxies, and the like.

Figure 7:
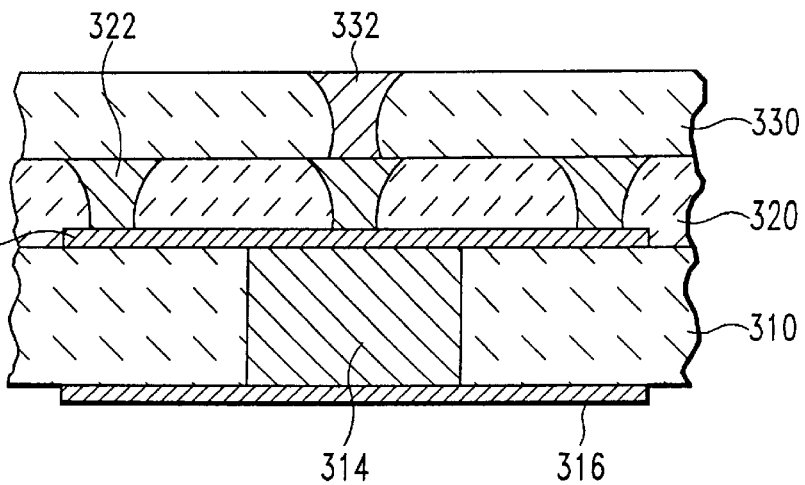
FIG. 7 illustrates a seventh embodiment of the present invention.
Figure 2A:
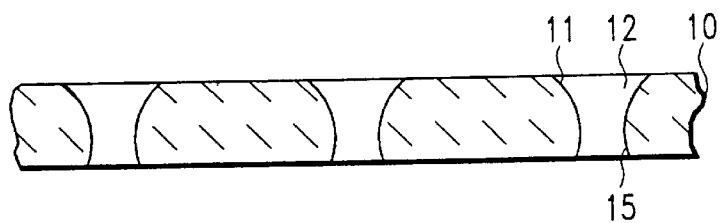
FIG. 2 illustrates a second embodiment of the present invention and a method for making the second embodiment.
Figure 2B:
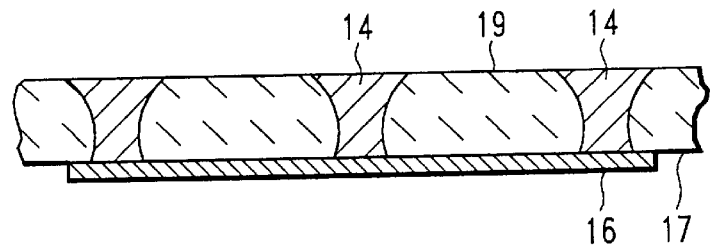
Figure 2C:
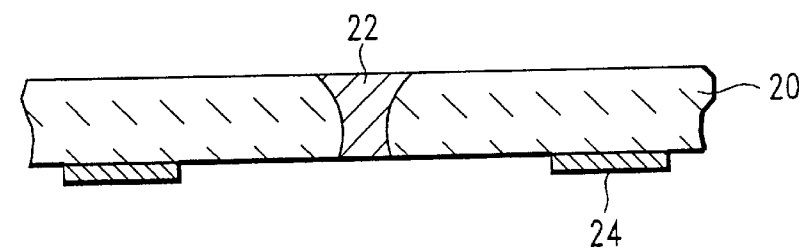
Figure 2D:
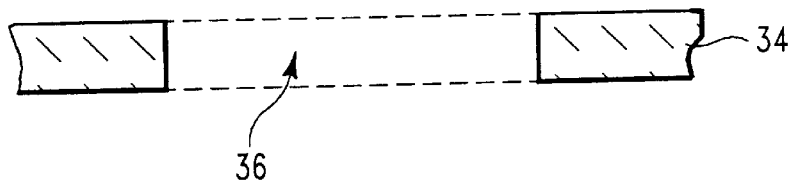
Figure 2E:
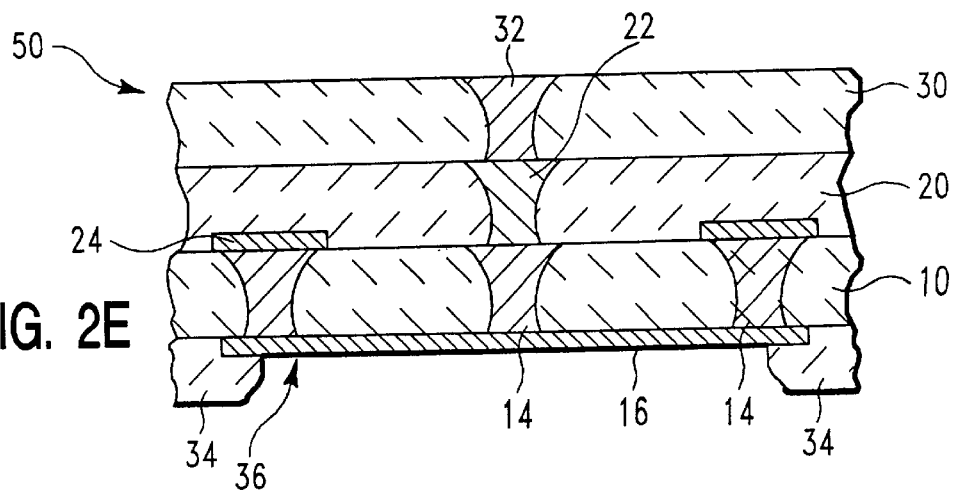
Figure 4A:
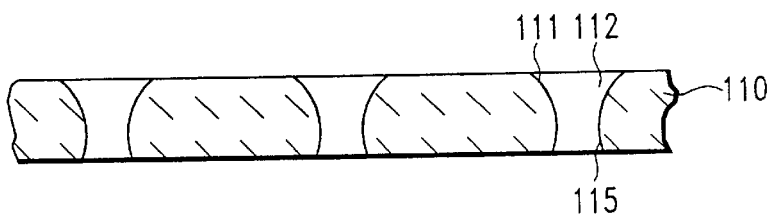
FIG. 4 illustrates a fourth embodiment of the present invention and a method for making the fourth embodiment.
Figure 4B:
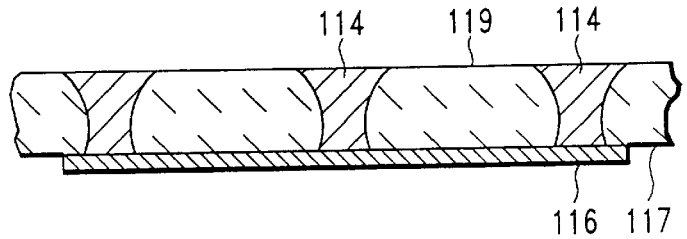
Figure 4C:
Figure 4D:
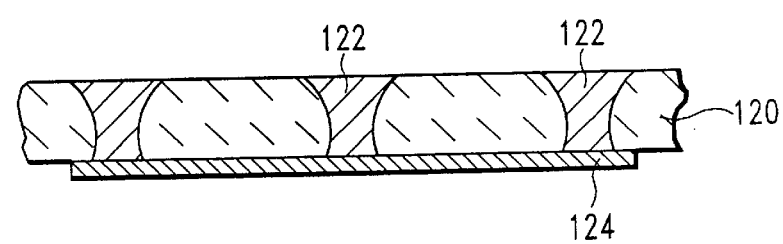
Figure 4E:
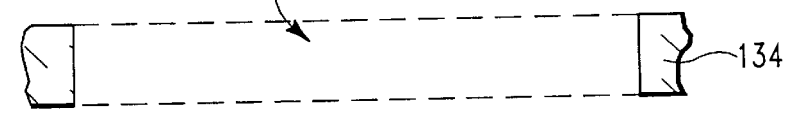
Figure 4F:
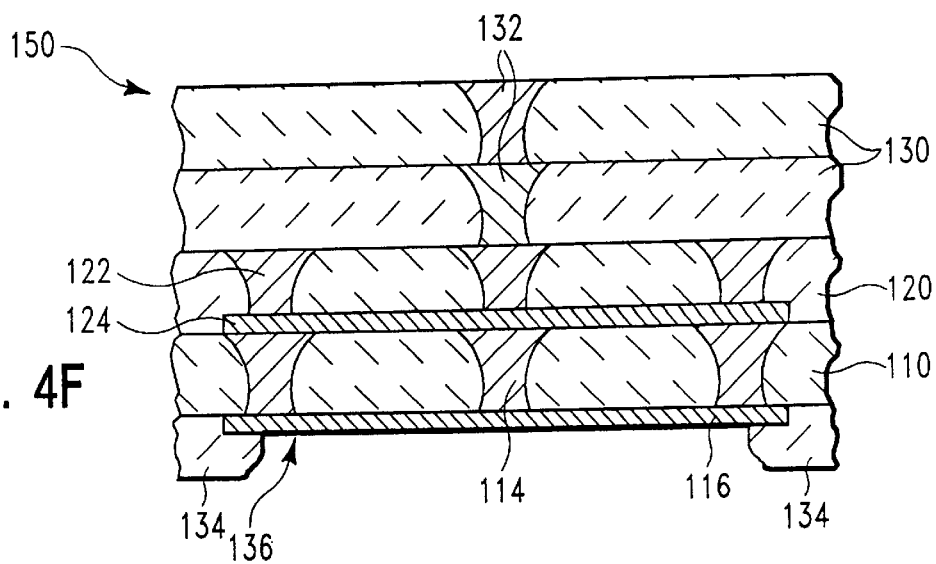
Figure 5A:
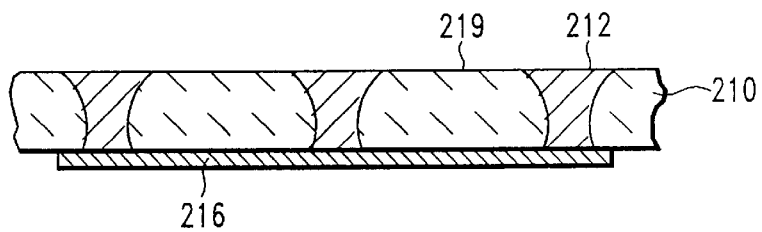
FIG. 5 illustrates a fifth embodiment of the present invention and a method for making the fifth embodiment.
Figure 5B:
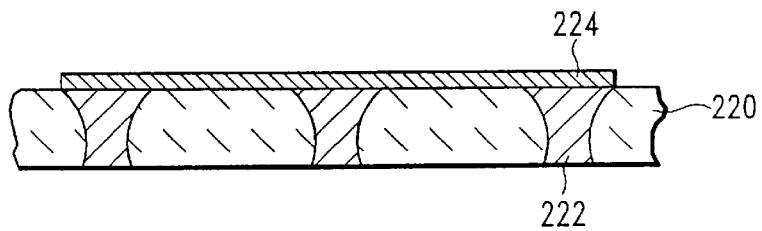
Figure 5C:
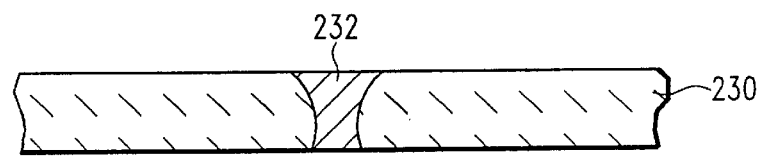
Figure 5D:
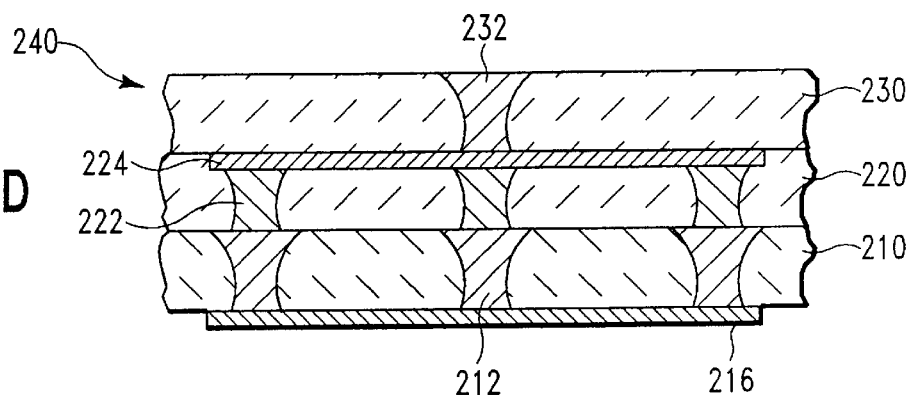
Figure 5E:
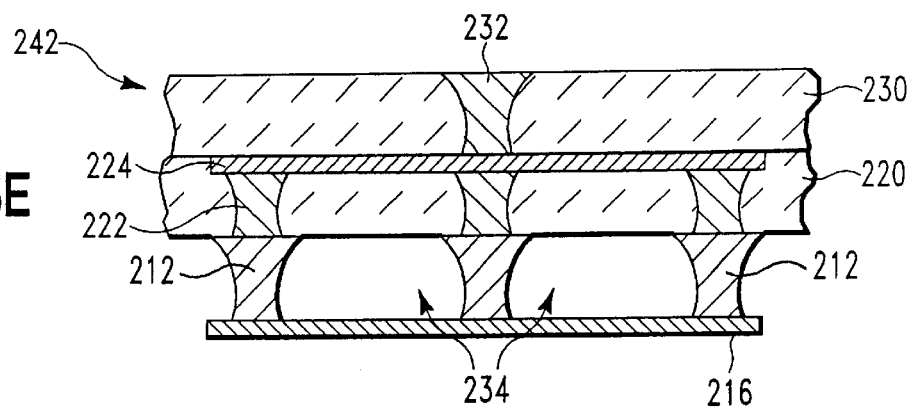
Figure 6A:
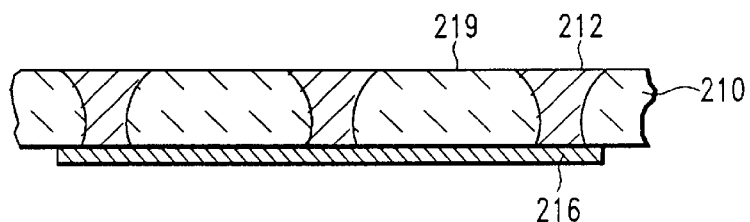
FIG. 6 illustrates a sixth embodiment of the present invention and a method for making the sixth embodiment.
Figure 6B:
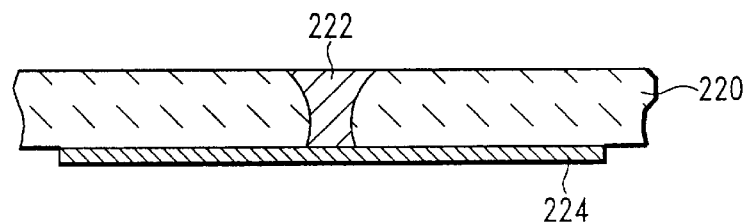
Figure 6C:
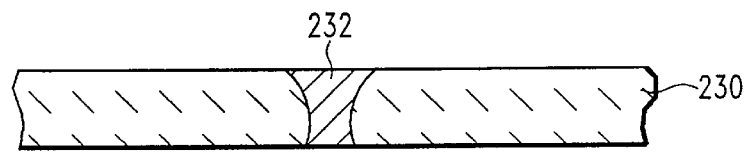
Figure 6D:
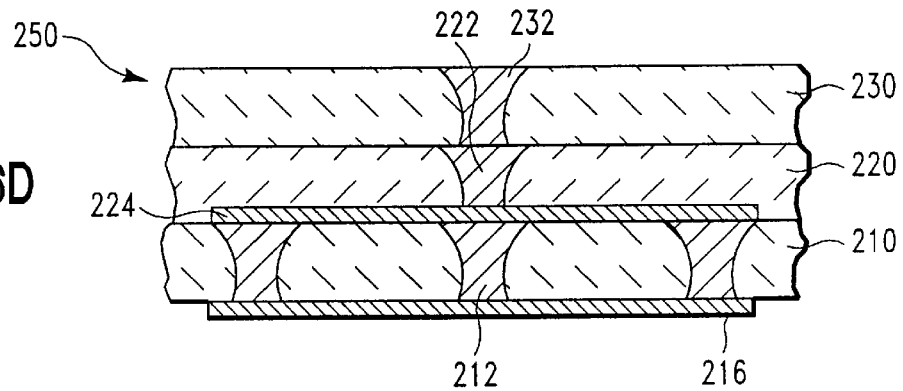
Figure 6E:
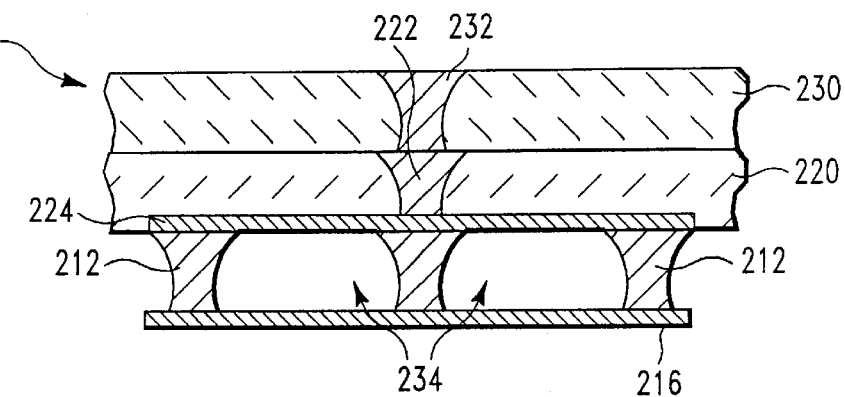

The last embodiment according to the present invention can be accomplished with any of the previous embodiments discussed in conjunction with FIGS. 1 to 4 to provide an even greater improvement in reliability. Referring now to FIG. 7, there is shown multilayer ceramic substrate 340 comprising first layer 310 having a single large metal-filled via 314 and outer pad 316, second layer 320 having metal-filled vias 322. Inner pad 324 is interposed between the first layer 310 and second layer 320. There is additionally optional layer or layers 330 having metal-filled via 332. The metal loading for large via 314 and outer pad 316 is high, preferably 100 volume % metal. The diameter of this large via 314 is smaller than the diameter of pads 316 and 324 and the thickness of layer 310 is greater than two times the diameter of the large via 314. Pad 324 and vias 322 are of moderate metal content and are chosen for providing good bonding to the ceramic material of the multilayer ceramic substrate 340. Via 332 is typically 100 volume % metal as is conventional.

There are several critical parameters in the formation of the structures as previously described which must be addressed to provide the best performance and reliability improvement.

The length of the vias having high metal content should be as long as possible within the constraints of module electrical performance. The longer the vias are, the greater the fatigue resistance. Via length can be increased by using thicker dielectric layers and/or by stacking multiple through-via layers together to form long via columns.

The highest number of vias that can be placed within the surface IO pad should be used. The electrical functionality of the pad will be determined by the connection of at least one via to the pad. The greater the number of vias connected to the pad, the longer an electrical connection will be maintained providing increased electrical reliability.

The greater the ductility and fatigue resistance of the anchoring vias, the greater the reliability as the vias are strained from thermal cycling. Thus ductile metals like Cu, Ag, Au and their alloys will last many more cycles of strain.

Where ceramics are used with poorly matched CTE metallization, such as systems with copper, nickel, gold and silver metallization and low CTE ceramics like glass ceramic with a CTE of 2–6 ppm, the metal in and on the outside dielectric layer (e.g., layer 10 in FIG. 1) should not be bonded to the ceramic. A very small gap of 1–10 microns typically can exist between this metal and adjacent ceramic surfaces. Since the metal in the outer layer is not chemically bonded to the ceramic, there is very little stress created in the outer ceramic layer. The vias of the outer layer are chemically well bonded and electrically connected to the metallization of the second layer (e.g., layer 20 in FIG. 1). The metallization of the second layer (e.g., layer 20) is typically well bonded to the ceramic and often this is produced by adding substantial amounts of a dielectric material. This dielectric filler is typically the same or very similar to the dielectric used in the ceramic greensheet layers.

The structures disclosed above can be used in a number of attachment methods. These include LGA, BGA and CGA second level connections to the ceramic. Structures disclosed in FIGS. 1 to 4 and 7 are particularly useful for ceramics which pose problems for reliably bonding surface metal and could be used for LGA applications where a compressive load would be applied to the pad during socketing and in use. Similarly, structures shown in FIGS. 5 and 6 with subsequent processing to fill in the space between the surface pads with a dielectric can also be used for compressive LGA applications. The structures disclosed in FIGS. 1 to 7 could be used for BGA and CGA applications where a solder is used to join the ceramic substrate to a circuit board or another ceramic. In these applications the outside surface pad and anchoring vias are not bonded to the ceramic. The anchoring vias provide improved mechanical and electrical reliability joining compared to pads bonded directly to the ceramic and provide additional strain relief to that from the solder join between the ceramic and the circuit board during thermal cycling. Structures and compositions disclosed in FIGS. 5 and 6 can be used to increase the second level attach thermal cycling reliability of traditional ceramics that have well bonded surface pads (such as alumina systems discussed earlier) by providing surface features that augment the fatigue resistance of traditional solder attach methods such as eutectic, solder ball and solder column attach.

EXAMPLE

As an example of the reliability improvement over traditional attach methods, several daisy chain electrical test vehicles were prepared from a 32 mm square glass ceramic substrate with a CTE of 3 ppm, approximately 1.9 mm thick, and copper metallization. After sintering and plating, each test vehicle was prepared with 90% lead+10% tin solder balls attached by eutectic tin-lead solder and then attached to an FR4 printed circuit board with a CTE of about 18 ppm, again using an eutectic tin-lead solder. The substrates and board were then thermal cycled from −55° C. to +110° C. at a rate of approximately 2 cycles per hour. The number of cycles at which the first fail occurred, always in the daisy chain connection on the substrate perimeter, was recorded. A control ceramic substrate made from high alumina ceramic with a CTE of about 6 ppm and the same thickness with a well bonded molybdenum metal based pad was included in the testing. Attempts to produce surface metal pads that were well attached to the low CTE ceramic and which could be plated and soldered gave highly variable but in general poor results. Often the surface metal pad would separate from the ceramic after less than 100 thermal cycles.

The same test vehicle using a structure as shown in FIG. 3 was prepared using 90% copper and 10% nickel metallization for vias 114 and outer pad 116 and 50% copper+50% dielectric composite metallization for vias 122 and inner pad 124 had first electrical fails typically after about 450 to 500 thermal cycles. These results compare favorably to the alumina control substrates which had first electrical fails after approximately 350 to 400 thermal cycles.

During thermal cycling the anchoring vias undergo considerable strain due to the CTE mismatch of the 3 ppm ceramic v. the 18 ppm circuit board. According to the present invention, the electrical continuity of each solder connection is maintained until the last electrically conductive anchoring via fails, at which time the daisy chain circuit opens and the substrate is considered to have electrically failed.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayer ceramic substrate with an anchored pad comprising:
   a first ceramic layer having a plurality of filled vias and an outer surface;
   at least one outer pad adjacent to the outer surface of the first ceramic layer, the at least one outer pad adhered to the plurality of filled vias in the first ceramic layer;
   a second ceramic layer adjacent to the first ceramic layer having at least one filled via in contact with at least one filled via of the first ceramic layer; and
   at least one inner pad interposed between the first and second ceramic layers and in contact with the plurality of filled vias in the first ceramic layer with each of the plurality of filled vias in the first ceramic layer being in contact with a via in the second ceramic layer or the inner pad.

2. The multilayer ceramic substrate of claim 1 further comprising a ceramic covering layer covering the first ceramic layer and the periphery of the at least one pad.

3. The multilayer ceramic substrate of claim 1 wherein the plurality of filled vias in the first ceramic layer comprise at least 80 volume percent metallic material and the remainder being ceramic material.

4. The multilayer ceramic substrate of claim 3 wherein the metallic material is selected from the group consisting of copper and alloys of copper, nickel and silver.

5. The multilayer ceramic substrate of claim 1 wherein the at least one outer pad comprises at least 80 volume percent metallic material, the remainder being ceramic material.

6. The multilayer ceramic substrate of claim 5 wherein the metallic material is selected from the group consisting of copper and alloys of copper, nickel and silver.

7. The multilayer ceramic substrate of claim 1 wherein the at least one filled via in the second layer comprises 30 to 70 volume percent metallic material, the remainder being ceramic material.

8. The multilayer ceramic substrate of claim 1 wherein the inner pad comprises 30 to 70 volume percent metallic material, the remainder being ceramic material.

9. The multilayer ceramic substrate of claim 1 wherein there are a plurality of filled vias in the second layer in contact with the at least one inner pad.

10. The multilayer ceramic substrate of claim 1 wherein there are a plurality of inner pads for each outer pad.

11. The multilayer ceramic substrate of claim 10 wherein at least one of the plurality of vias in the first ceramic layer in contact with one of the plurality of inner pads performs no electrical function.

12. The multilayer ceramic substrate of claim 1 wherein the plurality of vias in the first ceramic layer perform an electrical function.

13. The multilayer ceramic substrate of claim 1 wherein the plurality of filled vias in the first ceramic layer and the at least one outer pad comprise at least 80 volume percent metallic material, the remainder being ceramic material; and the at least one filled via in the second layer and the inner pad comprise 30 to 70 volume percent metallic material, the remainder being ceramic material.

14. A multilayer ceramic substrate with an anchored pad comprising:
   a first ceramic layer having a filled via and an outer surface;
   an outer pad adjacent to the outer surface of the first ceramic layer, the outer pad adhered to the filled via;
   a second ceramic layer adjacent to the first ceramic layer having at least one filled via in contact with the filled via of the first ceramic layer;
   an inner pad interposed between the first and second ceramic layers and in contact with the filled vias of the first and second layers;
   wherein the via in the first ceramic layer is larger in cross section than the via in the second ceramic layer and the first ceramic layer is thicker than the second ceramic layer.

15. The multilayer ceramic substrate of claim 14 wherein the filled via in the first ceramic layer comprises at least 80 volume percent metallic material, the remainder being ceramic material.

16. The multilayer ceramic substrate of claim 15 wherein the metallic material is selected from the group consisting of copper and alloys of copper, nickel and silver.

17. The multilayer ceramic substrate of claim 14 wherein the outer pad comprises at least 80 volume percent metallic material, the remainder being ceramic material.

18. The multilayer ceramic substrate of claim 17 wherein the metallic material is selected from the group consisting of copper and alloys of copper, nickel and silver.

19. The multilayer ceramic substrate of claim 14 wherein there are a plurality of vias in the second ceramic layer in contact with the via in the first ceramic layer.

20. A multilayer ceramic substrate with an anchored pad comprising:
   a first ceramic layer having a plurality of filled vias and an outer surface;
   a second ceramic layer adjacent to the first ceramic layer and having at least one filled via;
   at least one inner pad interposed between the first and second ceramic layers and in contact with the plurality of filled vias in the first ceramic layer and the at least one filled via in the second ceramic layer;
   a plurality of via columns extending from the outer surface of the first ceramic layer, the plurality of via columns being in contact with the plurality of filled vias of the first ceramic layer; and
   at least one pad adhered to the plurality of via columns.

21. The multilayer ceramic substrate of claim 20 wherein the via columns comprise at least 80 volume percent metallic material with the remainder being ceramic material.

22. The multilayer ceramic substrate of claim 21 wherein the metallic material is selected from the group consisting of copper and alloys of copper, nickel and silver.

23. The multilayer ceramic substrate of claim 20 wherein the outer pad adhered to the plurality of via columns comprises at least 80 volume percent metallic material with the remainder being ceramic material.

24. The multilayer ceramic substrate of claim 20 wherein the filled plurality of vias comprise 30 to 70 volume percent metallic material, the remainder being ceramic material.

25. The multilayer ceramic substrate of claim 20 wherein the inner pad comprises 30 to 70 volume percent metallic material, the remainder being ceramic material.

26. The multilayer ceramic substrate of claim 20 wherein there is no ceramic material in the space between the first ceramic layer and the at least one pad adhered to the plurality of via columns.

27. The multilayer ceramic substrate of claim 20 wherein the via columns and the outer pad adhered to the plurality of via columns comprise at least 80 volume percent metallic material with the remainder being ceramic material; and the filled plurality of vias and the inner pad comprise 30 to 70 volume percent metallic material, the remainder being ceramic material.

28. A multilayer ceramic substrate with an anchored pad comprising:
   a ceramic layer having at least one filled via and an outer surface;
   an inner pad adhered to the outer surface of the ceramic layer and in contact with the at least one filled via in the first ceramic layer;
   a plurality of via columns extending from the inner pad; and
   an outer pad adhered to the plurality of via columns.

29. The multilayer ceramic substrate of claim 28 wherein the via columns comprise at least 80 volume percent metallic material with the remainder being ceramic material.

30. The multilayer ceramic substrate of claim 29 wherein the metallic material is selected from the group consisting of copper and alloys of copper, nickel and silver.

31. The multilayer ceramic substrate of claim 28 wherein the outer pad comprises at least 80 volume percent metallic material with the remainder being ceramic material.

32. The multilayer ceramic substrate of claim 28 wherein the at least one filled via in the ceramic layer comprises 30 to 70 volume percent metallic material, the remainder being ceramic material.

33. The multilayer ceramic substrate of claim 28 wherein the inner pad comprises 30 to 70 volume percent metallic material, the remainder being ceramic material.

34. The multilayer ceramic substrate of claim 28 wherein there is no ceramic material in the space between the inner and outer pads.

35. The multilayer ceramic substrate of claim 28 wherein the via columns and the outer pad comprise at least 80 volume percent metallic material with the remainder being ceramic material; and the at least one filled via in the ceramic layer and the inner pad comprise 30 to 70 volume percent metallic material, the remainder being ceramic material.

* * * * *